(12) United States Patent
De Kock et al.

(10) Patent No.: US 10,029,331 B2
(45) Date of Patent: Jul. 24, 2018

(54) MULTIPLE LASER BEAM FOCUSING HEAD

(75) Inventors: Joel A. De Kock, New Richmond, WI (US); James J. Bucklew, Somerset, WI (US); Steve P. Wenberg, Hammond, WI (US)

(73) Assignee: Preco, Inc., Somerset, WI (US)

( * ) Notice: Subject to any disclaimer, the term of this patent is extended or adjusted under 35 U.S.C. 154(b) by 910 days.

(21) Appl. No.: 12/879,683

(22) Filed: Sep. 10, 2010

(65) Prior Publication Data

US 2011/0062128 A1    Mar. 17, 2011

Related U.S. Application Data

(60) Provisional application No. 61/242,177, filed on Sep. 14, 2009.

(51) Int. Cl.

| | |
|---|---|
| *B23K 26/06* | (2014.01) |
| *B23K 26/00* | (2014.01) |
| *B23K 26/067* | (2006.01) |
| *B23K 26/046* | (2014.01) |
| *C21D 1/09* | (2006.01) |
| *C21D 1/34* | (2006.01) |
| *C21D 9/32* | (2006.01) |
| *H01S 5/00* | (2006.01) |
| *B23K 103/00* | (2006.01) |

(52) U.S. Cl.
CPC ...... *B23K 26/0676* (2013.01); *B23K 26/0006* (2013.01); *B23K 26/0066* (2013.01); *B23K 26/046* (2013.01); *C21D 1/09* (2013.01); *C21D 1/34* (2013.01); *C21D 9/32* (2013.01); *B23K 2203/40* (2015.10); *B23K 2203/50* (2015.10); *H01S 5/005* (2013.01)

(58) Field of Classification Search
CPC ............ B23K 26/0009; B23K 26/0066; B23K 26/046; B23K 26/0676; C21D 1/09; C21D 1/34; C21D 9/32; H01S 5/005
USPC ........................................ 219/121.6–121.81
See application file for complete search history.

(56) References Cited

U.S. PATENT DOCUMENTS

| | | |
|---|---|---|
| 4,304,978 A | 12/1981 | Saunders |
| 4,761,535 A | 8/1988 | Lawson |

(Continued)

OTHER PUBLICATIONS

Japanese Patent Abstract, 2003117675, Nanovia LP, Apr. 23, 2003.
PCT International Search Report, dated Mar. 31, 2011.
PCT Written Opinion, dated Mar. 31, 2011.

*Primary Examiner* — Sang Y Paik
(74) *Attorney, Agent, or Firm* — Westman, Champlin & Koehler, P.A.; Z. Peter Sawicki; Amanda M. Prose

(57) ABSTRACT

An apparatus that divides a single laser beam into two or more beams that can be directed at an object, such as a work piece, to perform laser heat treatment is disclosed. An adapter stage is in optical communication with a light source, such as a laser source, and arranged to receive a light beam from the light source. A focus stage in optical communication with the adapter stage is arranged to receive the light beam from the adapter stage and to focus the light beam. A beam splitting stage in optical communication with the focus stage is arranged to receive the focused light beam and to split the focused light beam into a multiple light beams. A redirection stage in optical communication with the beam splitting stage is arranged to receive the multiple light beams and to direct them toward a plurality of target locations on the object.

16 Claims, 3 Drawing Sheets

(56) References Cited

U.S. PATENT DOCUMENTS

| | | | |
|---|---|---|---|
| 4,844,574 A * | 7/1989 | Chande | 385/33 |
| 4,909,818 A * | 3/1990 | Jones | 65/31 |
| 4,916,272 A | 4/1990 | Okumoto et al. | |
| 5,160,556 A | 11/1992 | Hyde et al. | |
| 5,180,448 A | 1/1993 | Hyde et al. | |
| 5,245,384 A * | 9/1993 | Mori | 355/67 |
| 5,313,042 A | 5/1994 | Matsuyama et al. | |
| 5,336,216 A | 8/1994 | Dewey | |
| 5,422,758 A | 6/1995 | Lawson | |
| 5,449,879 A | 9/1995 | Lawson et al. | |
| 5,452,054 A * | 9/1995 | Dewa et al. | 355/67 |
| 5,521,352 A | 5/1996 | Lawson | |
| 6,489,589 B1 * | 12/2002 | Alexander | 219/121.69 |
| 7,005,601 B2 * | 2/2006 | Jennings | 219/121.66 |
| 7,295,292 B1 | 11/2007 | Jumper et al. | |
| 2002/0162825 A1 * | 11/2002 | Lizotte et al. | 219/121.7 |
| 2004/0222197 A1 * | 11/2004 | Hiramatsu | 219/121.7 |
| 2008/0083886 A1 | 4/2008 | Faklis et al. | |

\* cited by examiner

MULTIPLE LASER BEAM FOCUSING HEAD

CROSS-REFERENCE TO RELATED APPLICATION

The present application is based on and claims the benefit of U.S. provisional patent application Ser. No. 61/242,177, filed Sep. 14, 2009, the content of which is hereby incorporated by reference in its entirety.

TECHNICAL BACKGROUND

The disclosure relates generally to manufacturing processes employing lasers. More particularly, the disclosure relates to focusing heads for use in heat treatment in metals.

BACKGROUND

Lasers can be used for heat treatment of metals. One traditional approach in laser heat treating involves using a single laser beam that is directed to the surface area that is intended to be treated. However, there are many products, such as gears, knives, dies, corrugation rolls, etc., for which heat treatment using a single beam suffers from certain drawbacks. For example, if a single laser beam is used in the heat treating process, the laser spot performing the treatment can only treat an area that is within line-of-sight of the beam. Thus, certain structures, such as gear teeth, are treated using multiple passes of a single laser beam.

In conventional heat treatment approaches that use a single laser beam, if multiple sides of a feature that require heat treatment are not treated concurrently, the heat energy from a subsequent pass of the laser beam can affect the result of a previous pass of the laser beam. For example, in the case of a gear tooth, if one flank of the tooth is treated first and then the other flank is treated in a second pass of the laser beam, the heat introduced by the second pass will affect the treatment produced on the first flank.

In addition to tempering or softening that can occur due to multiple passes of a laser beam, an additional problem has been experienced in laser heat treatment of materials. In particular, once the angle of incidence of the laser beam goes below approximately 45°, the vast majority of the incident light is reflected. As a result, the amount of light that is absorbed by the material is insufficient to effectively heat treat the material efficiently. For example, in the heat treatment of the cutting edge of a knife, if the laser beam is directed at the edge of the knife, in the plane of the blade, the material will absorb very little of the energy of the laser beam.

SUMMARY OF THE DISCLOSURE

A laser focusing head divides a single laser beam into two or more beams that can be directed at an object, such as a work piece to perform laser heat treatment. The laser focusing head includes a number of functional stages that focus a laser beam, split the laser beam into multiple laser beams, and redirect the multiple laser beams toward target locations on the work piece.

In one aspect, an apparatus is described for directing multiple light beams toward an object. The apparatus includes an adapter stage in optical communication with a light source and arranged to receive a first light beam from the light source. A focus stage is in optical communication with the adapter stage and is arranged to receive the first light beam from the adapter stage and to focus the first light beam. A beam splitting stage in optical communication with the focus stage is arranged to receive the focused first light beam and to split the focused first light beam into a plurality of second light beams. A redirection stage is in optical communication with the beam splitting stage and is arranged to receive the second light beams and to direct the second light beams toward a plurality of target locations on the object. In some embodiments, the light source is a laser source, and the first light beam and second light beams are laser beams.

In a further aspect, a laser heat treatment apparatus includes a laser adapter stage in optical communication with a laser source and arranged to receive a first laser beam from the laser source. A focus stage is in optical communication with the laser adapter stage and is arranged to receive the first laser beam from the adapter stage and to focus the first laser beam. A beam splitting stage in optical communication with the focus stage is arranged to receive the focused first laser beam and to split the focused first laser beam into two second laser beams. A redirection stage in optical communication with the beam splitting stage is arranged to receive the second laser beams and to direct the second laser beams toward a plurality of corresponding target locations on the object such that each of the second laser beams has an angle of incidence to its corresponding target location of substantially 90°.

In yet another aspect a method is described for directing multiple laser beams toward an object in which a first laser beam is received from a laser source and is focused. The focused laser beam is split into a plurality of second laser beams, which are redirected toward a plurality of target locations on the object.

Various aspects of this disclosure may provide certain advantages. For instance, treating a work piece with multiple laser beams simultaneously may avoid the effect of heat energy from subsequent passes of a single laser beam on the heat treatment produced by a previous pass of the laser beam. In addition, various aspects of the embodiment disclosed herein may promote improved angles of incidence of the multiple laser beams, resulting in improved energy absorption by the work piece.

DESCRIPTION OF VARIOUS EMBODIMENTS

A laser focusing head divides a single laser beam into two or more beams that can be directed at a work piece to perform laser heat treatment. The laser focusing head includes a number of functional stages that focus a laser beam, split the laser beam into multiple laser beams, and redirect the multiple laser beams toward target locations on the work piece.

The following description implemented in the context of laser heat treatment of metals is to be construed by way of illustration rather than limitation. This description is not intended to limit the scope of the disclosure or the applications or uses of the subject matter disclosed in this specification. For example, while various embodiments are described as being implemented in this context, it will be appreciated that the principles of the disclosure are applicable to laser apparatuses operable in other environments, such as welding and cutting processes in which splitting a laser beam can improve efficiency or productivity.

In the following disclosure, numerous specific details are set forth in order to provide a thorough understanding of various embodiments. It will be apparent to one skilled in the art that some embodiments may be practiced without some or all of these specific details. In other instances, well known components and process steps have not been described in detail.

Figure 1:
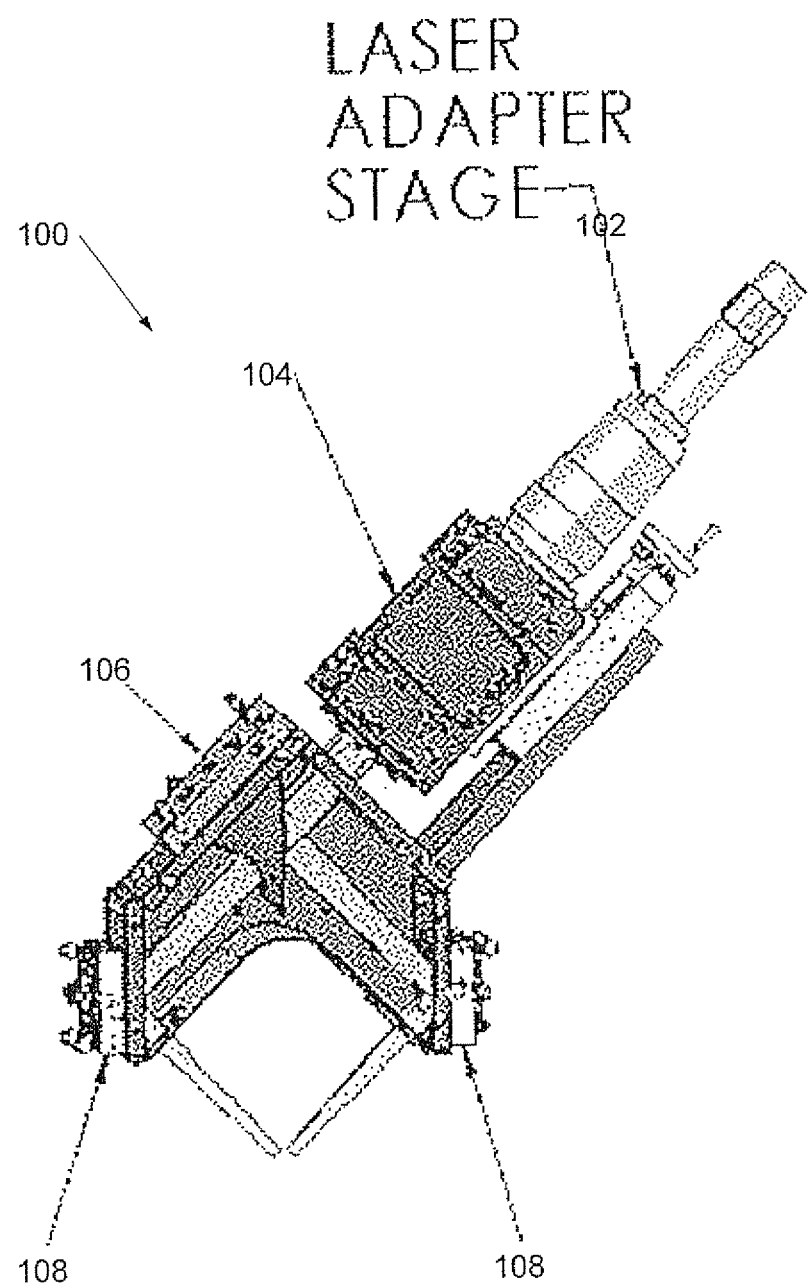
FIG. 1 is a plan view of an example laser heat treatment apparatus according to one embodiment.

Referring now to the drawings, FIG. 1 illustrates an example laser heat treatment apparatus 100. The laser heat treatment apparatus 100 may be used with a fiber-delivered laser or with a laser that is not fiber-delivered. The laser heat treatment apparatus 100 includes a number of functional stages. A laser adapter stage 102 facilitates coupling a laser beam source to the laser heat treatment apparatus 100. FIG. 1 depicts a laser adapter stage 102 for a fiber-delivered laser. It will be appreciated by those of ordinary skill in the art that a similar stage can be employed for use with a laser that is not fiber-delivered. The laser adapter stage 102 may include re-collimation optics.

After the laser beam passes through the laser adapter stage 102, it enters a focus stage 104 that is in optical communication with the laser adapter stage 102. The focus stage 104 may include traditional lenses or an integrating lens, or both. The focus stage 104 uses the lens or lenses to perform beam shaping.

After the laser beam passes through the focus stage 104, a beam splitting stage 106 that is in optical communication with the focus stage 104 splits the laser beam into two beams. In some aspects of this disclosure, the components of the beam splitting stage 106 are selected and arranged symmetrically so that the two beams are substantially equal in energy content. In other aspect, the components of the beam splitting stage 106 may be selected and arranged to provide an unequal distribution of energy content such that one beam may have a higher energy content than the other beam. It will be appreciated by those of ordinary skill in the art that, while the beam splitting stage 106 is described as splitting the laser beam into two beams, some implementations of the beam splitting stage 106 may split the laser beam into a greater number of beams with equal or unequal energy distributions.

The laser beams emitted from the beam splitting stage 106 then enter a redirection stage 108, which is in optical communication with the beam splitting stage 106 and which redirects the laser beams to a proper point in space to facilitate concurrent treatment of a geometric feature of the work piece, such as two sides of a gear tooth. The redirection stage 108 contains optics that redirect the laser beams at the appropriate angle to achieve efficient heat treatment. For example, the redirection stage 108 redirects the laser beams so that they are directed toward multiple corresponding target locations of a work piece at angles of incidence of substantially 90°. When the laser beams are nearly perpendicular to the surfaces, the absorption of energy from the laser beams is significantly enhanced as compared with other angles of incidence. Because there are many products with geometries like gears, knives, flutes, splines, etc., the disclosure described herein may significantly enhance the efficiency of laser heating of parts with similar requirements.

Figure 2:
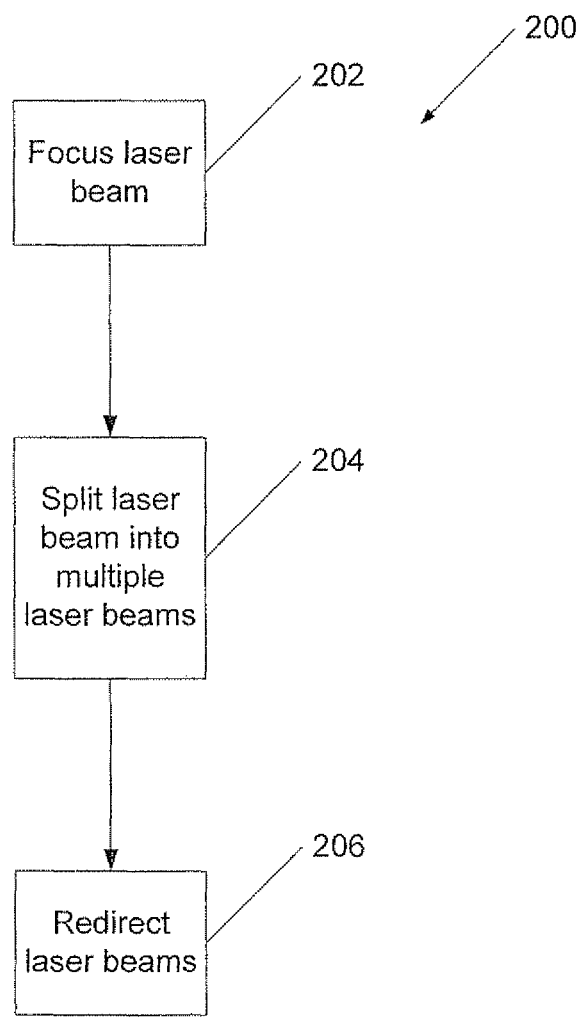
FIG. 2 is a flow diagram illustrating an example method for heat treating a material according to another embodiment.

FIG. 2 illustrates an example method 200 for performing a heat treatment process on a work piece using the laser heat treatment apparatus 100 of FIG. 1. After passing through the laser adapter stage 102, a single laser beam is focused by the focus stage 104 at a step 202. Next, at a step 204, the beam splitting stage 106 splits the single laser beam into multiple laser beams. The redirection stage 108 then redirects the laser beams to appropriate locations on the work piece at a step 206. As disclosed above, the laser beams are redirected so as to be incident on the locations on the work piece at substantially 90° angles.

Figure 3:
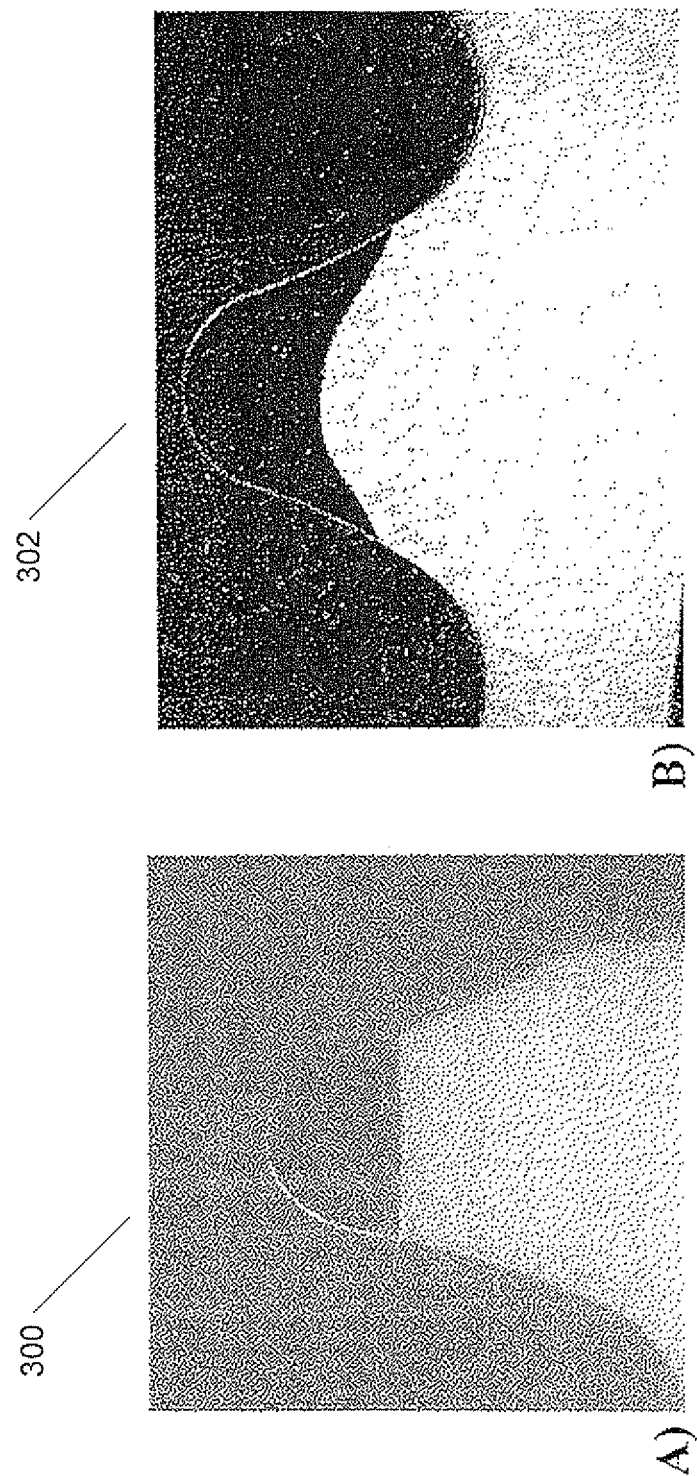
FIG. 3 illustrates results of a laser heat treatment process performed by the laser heat treatment apparatus of FIG. 1.

FIG. 3 illustrates results of a laser heat treatment process performed by the laser heat treatment apparatus 100 of FIG. 1. In particular, FIG. 3 illustrates the beneficial result that the laser heat treatment apparatus 100 can have on the heat treatment of corrugation rolls for the paper industry. For corrugation rolls, the traditional approach has been to use a single beam targeted at the crest of the flute, thus producing a treated cap, but with very little absorption on the flanks. This approach is demonstrated by a first sample 300, which was treated using a single laser beam at 24 IPM that produced a case depth at the center of 0.065 inch. By splitting the beam and redirecting the beams to both sides of the flute, a treatment with greater surface coverage and better overall efficiency is produced. This improved approach is demonstrated by a second sample 302, which was treated using dual laser beams at 45 IPM that produced a case depth at the center of 0.071 inch. Comparing the two samples 300, 302 shown in FIG. 3, greater surface area and volume of treated material were produced at nearly twice the feed rate using the dual beam approach as compared to a traditional single beam approach.

While this disclosure describes heat treatment of materials in the context of using a laser, it will be appreciated that the principles of this disclosure are applicable in other contexts, such as welding and cutting processes in which a split beam approach can improve efficiency or productivity.

As demonstrated by the foregoing discussion, various aspects of this disclosure may provide certain advantages. For instance, treating a work piece with multiple laser beams simultaneously may avoid the effect of heat energy from subsequent passes of a single laser beam on the heat treatment produced by a previous pass of the laser beam. A variety of products, including, for example, gears, knives, dies, corrugation rolls, etc., may benefit from simultaneous treatment by multiple laser beams. In addition, various aspects of this disclosure may promote improved angles of incidence of the multiple laser beams, resulting in improved energy absorption by the work piece. Because there are many products with geometries like gears, knives, flutes, splines, etc., the principles of this disclosure may significantly enhance the efficiency of laser heating of parts with similar requirements.

It will be understood by those who practice the embodiments described herein and those skilled in the art that various modifications and improvements may be made without departing from the spirit and scope of the disclosed embodiments. The scope of protection afforded is to be determined solely by the claims and by the breadth of interpretation allowed by law.

Although the present invention has been described with reference to preferred embodiments, workers skilled in the art will recognize that changes may be made in form and detail without departing from the spirit and scope of the invention.

What is claimed is:

1. A laser heat treatment apparatus configured to concurrently direct a plurality of laser beams to a plurality of target locations on a metal workpiece comprising:

a laser adapter stage in optical communication with a laser source and arranged to receive a first laser beam from the light source;
a focus stage in optical communication with the laser adapter stage and arranged to receive the first laser beam from the adapter stage and to focus the first laser beam;
a beam splitting stage in optical communication with the focus stage and arranged to receive the focused first laser beam and to split the focused first laser beam into two second laser beams; and
a redirection stage in optical communication with the beam splitting stage and arranged to receive the second laser beams and to direct the second laser beams toward the plurality of target locations on the metal workpiece such that at least a first target location avoids the effects of heat transfer from heat treating at least a second target location, wherein the plurality of target locations on the metal workpiece are corresponding locations on a plurality of sides of a same feature of the workpiece and where each of the second laser beams has an angle of incidence to its corresponding target location of substantially 90° and where each of the second laser beams is concurrently directed to a target location.

2. The laser heat treatment apparatus of claim 1, wherein the adapter stage comprises re-collimation optics.

3. The laser heat treatment apparatus of claim 1, wherein the focus stage comprises a plurality of lenses.

4. The laser heat treatment apparatus of claim 1, wherein the focus stage comprises an integrating lens.

5. The laser heat treatment apparatus of claim 1, wherein the second laser beams have substantially equal energy content.

6. The laser heat treatment apparatus of claim 1, wherein the second laser beams have unequal energy content.

7. The apparatus of claim 1, wherein the concurrently heat treated target locations have a substantially equal hardness after heat treating, such that the at least the first heat treated target location is not effectively softened by heat treating the at least second target location.

8. A method for directing multiple laser beams concurrently toward an object for heat treating an object with a first laser pass, the method comprising:
receiving a first laser beam from a laser source;
focusing the first laser beam;
splitting the focused first laser beam into a plurality of second laser beams; and
redirecting the second laser beams concurrently toward a plurality of target locations positioned on a plurality of sides of a same feature of the object wherein the plurality of target locations are positioned with respect to each other such that heat treatment of a first target location avoids effects of the heat treatment of second locations; and
passing the laser beams along the plurality of target locations such that the heat treatment of the second locations do not harm the heat treatment of the first location when processing the object.

9. The method of claim 8, wherein splitting the focused first laser beam comprises splitting the focused first laser beam into a plurality of second laser beams having substantially equal energy content.

10. The method of claim 8, wherein splitting the focused first laser beam comprises splitting the focused first laser beam into a plurality of second laser beams having unequal energy content.

11. The method of claim 8, wherein redirecting the second laser beams toward a plurality of target locations on the object comprises redirecting each of the plurality of second laser beams toward a corresponding target location on the object at an angle of incidence of substantially 90°.

12. The method of claim 8, wherein the concurrently heat treated target locations have a substantially equal hardness from heat treating, such that the at least the first heat treated target location is not effectively softened by heat treating the at least second target location.

13. A method for heat treating a metal using multiple laser beams directed concurrently toward a metal workpiece comprising:
receiving a first laser beam from a laser source;
focusing the first laser beam;
splitting the focused first laser beam into a plurality of second laser beams; and
redirecting the second laser beams toward a plurality of target locations on the metal workpiece, wherein the target locations are positioned on a plurality of sides of a same feature of the metal workpiece such that at least a first target location is affected by heat transfer from heat treating at least a second target location;
wherein the plurality of laser beams are concurrently directed to at least a first and a second target location on the same feature of the workpiece so as to concurrently heat treat a plurality of target locations of the metal workpiece such that the heat treatment of one target location avoids effects of heat treatment of another target location when laser processing the feature.

14. The method of claim 13, wherein splitting the focused first laser beam comprises splitting the focused first laser beam into a plurality of second laser beams having substantially equal energy content.

15. The method of claim 13, wherein splitting the focused first laser beam comprises splitting the focused first laser beam into a plurality of second laser beams having unequal energy content.

16. The method of claim 13, wherein the concurrently heat treated target locations have a substantially equal hardness from heat treating, such that the at least the first heat treated target location is not effectively softened by heat treating the at least second target location.

* * * * *